United States Patent
Grassmann et al.

(10) Patent No.: US 10,461,017 B2
(45) Date of Patent: Oct. 29, 2019

(54) PACKAGE WITH PARTIALLY ENCAPSULATED COOLING CHANNEL FOR COOLING AN ENCAPSULATED CHIP

(71) Applicant: Infineon Technologies AG, Neubiberg (DE)

(72) Inventors: Andreas Grassmann, Regensburg (DE); Wolfram Hable, Neumarkt (DE); Juergen Hoegerl, Regensburg (DE); Ivan Nikitin, Regensburg (DE); Achim Strass, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/665,574

(22) Filed: Aug. 1, 2017

(65) Prior Publication Data
US 2018/0040537 A1 Feb. 8, 2018

(30) Foreign Application Priority Data

Aug. 2, 2016 (DE) .......................... 10 2016 114 303

(51) Int. Cl.
*H01L 23/473* (2006.01)
*B60R 16/02* (2006.01)
*H01L 21/56* (2006.01)
*H01L 23/31* (2006.01)
*H01L 23/433* (2006.01)
(Continued)

(52) U.S. Cl.
CPC ............ *H01L 23/473* (2013.01); *B60R 16/02* (2013.01); *H01L 21/565* (2013.01); *H01L 23/3114* (2013.01); *H01L 23/4334* (2013.01); *H01L 23/46* (2013.01); *H01L 21/4871* (2013.01); *H01L 23/3157* (2013.01); *H01L 23/3737* (2013.01); *H01L 23/42* (2013.01); *H01L 24/29* (2013.01); *H01L 24/32* (2013.01); *H01L 24/48* (2013.01); *H01L 25/072* (2013.01); *H01L 2224/05014* (2013.01); *H01L 2224/06181* (2013.01); *H01L 2224/291* (2013.01); *H01L 2224/32225* (2013.01); *H01L 2224/32245* (2013.01); *H01L 2224/48247* (2013.01);
(Continued)

(58) Field of Classification Search
CPC . H01L 23/473; H01L 21/4871; H01L 21/565; H01L 23/3114; B60R 16/02
See application file for complete search history.

(56) References Cited

U.S. PATENT DOCUMENTS

2002/0185726 A1 12/2002 North
2005/0046020 A1 3/2005 Andou
(Continued)

FOREIGN PATENT DOCUMENTS

CN 101946395 A 1/2011
CN 102612747 A 7/2012
(Continued)

*Primary Examiner* — Elias Ullah

(57) ABSTRACT

A power module which comprises a semiconductor chip, at least one cooling plate with at least one cooling channel thermally coupled to the semiconductor chip and being configured so that a coolant is guidable through the at least one cooling channel, and an encapsulant encapsulating at least part of the semiconductor chip and part of the at least one cooling channel, wherein at least part of a main surface of the cooling plate forms part of an external surface of the power module.

15 Claims, 4 Drawing Sheets

(51) Int. Cl.
    *H01L 23/46*     (2006.01)
    *H01L 21/48*     (2006.01)
    *H01L 23/373*    (2006.01)
    *H01L 23/42*     (2006.01)
    *H01L 23/00*     (2006.01)
    *H01L 25/07*     (2006.01)

(52) U.S. Cl.
    CPC ............... *H01L 2224/73265* (2013.01); *H01L 2924/13055* (2013.01)

(56) References Cited

U.S. PATENT DOCUMENTS

| | | |
|---|---|---|
| 2008/0224303 A1 | 9/2008 | Funakoshi et al. |
| 2011/0205706 A1 | 8/2011 | Higashibata |
| 2011/0299265 A1* | 12/2011 | Nakatsu ................ B60L 11/14 361/820 |
| 2013/0264702 A1 | 10/2013 | Nishi et al. |
| 2014/0332950 A1 | 11/2014 | Iwata et al. |

FOREIGN PATENT DOCUMENTS

| | | |
|---|---|---|
| CN | 105590930 A | 5/2016 |
| DE | 4217289 A | 12/1993 |
| DE | 102014104177 A1 | 10/2014 |
| EP | 1622199 A | 2/2006 |
| EP | 2001048 A | 12/2008 |
| JP | 2006-303290 A | 11/2006 |
| JP | 2008-28163 A | 2/2008 |
| JP | 2008-124430 A | 5/2008 |
| JP | 2012-178513 A | 9/2012 |
| JP | 2015 133402 A | 7/2015 |

\* cited by examiner

PACKAGE WITH PARTIALLY ENCAPSULATED COOLING CHANNEL FOR COOLING AN ENCAPSULATED CHIP

BACKGROUND OF THE INVENTION

Field of the Invention

The present invention relates to a power module, to a package, to a vehicle, to a method of use, to a method of manufacturing a power module, and to a method of manufacturing a package.

Description of the Related Art

A power module, for instance for automotive applications, provides a physical containment for power components, usually power semiconductor devices in form of electronic chips comprising one or more integrated circuit elements. Examples of integrated circuit elements of power modules are an insulated-gate bipolar transistor (IGBT), and a diode.

There is still potentially room to reduce manufacturing cost and to simplify connecting the electronic chips of power modules to an outer circuit while efficiently removing heat.

SUMMARY OF THE INVENTION

There may be a need for a package allowing for an efficient removal of heat generated during operation while being simple in manufacture.

According to an exemplary embodiment, a power module is provided which comprises a semiconductor chip, at least one cooling plate with at least one cooling channel thermally coupled to the semiconductor chip and being configured so that a coolant (such as a fluid, i.e. a gas and/or a liquid) is guidable through the at least one cooling channel, and an encapsulant encapsulating at least part of the semiconductor chip and part of the at least one cooling channel, wherein at least part of a main surface of the cooling plate forms part of an external surface of the power module.

According to another exemplary embodiment, a package is provided which comprises an electronic chip having a first main surface and an opposing second main surface, a first cooling channel thermally coupled to the first main surface of the electronic chip and being configured so that a coolant is guidable through the first cooling channel, a second cooling channel thermally coupled to the second main surface of the electronic chip and being configured so that a coolant is guidable through the second cooling channel, and an encapsulant encapsulating at least part of the electronic chip, part of the first cooling channel and part of the second cooling channel, wherein at least a section of at least one of the first cooling channel and the second cooling channel (in particular at least a section of a cooling plate including the at least one first cooling channel or the at least one second cooling channel, respectively) is circumferentially (i.e. around a flowing direction of the coolant) partially covered by the encapsulant and partially exposed from the encapsulant.

According to still another exemplary embodiment, a method of manufacturing a power module is provided, wherein the method comprises thermally coupling a semiconductor chip with at least one cooling plate having at least one cooling channel (which may have a hollow conduit) through which a coolant is guidable, and encapsulating at least part of the semiconductor chip and part of the at least one cooling channel by an encapsulant so that at least part of a main surface of the cooling plate forms part of an external surface of the power module.

According to yet another exemplary embodiment, a method of manufacturing a package is provided, wherein the method comprises thermally coupling a first main surface of an electronic chip to a first cooling channel (which may delimit a hollow lumen) through which a coolant is guidable, thermally coupling a second main surface of the electronic chip to a second cooling channel (which may delimit a hollow lumen) through which a coolant is guidable, and encapsulating at least part of the electronic chip and part of the first cooling channel and part of the second cooling channel by an encapsulant so that at least a section (in particular a section on and/or in a material block of the package comprising at least the at least one electronic chip and the encapsulant) of at least one of the first cooling channel and the second cooling channel is circumferentially partially covered by the encapsulant and partially exposed from the encapsulant.

According to yet another exemplary embodiment, a vehicle is provided which comprises a power module having the above mentioned features or a package having the above mentioned features.

According to yet another exemplary embodiment, a power module having the above mentioned features or a package having the above mentioned features is used for an automotive application.

An exemplary embodiment may have the advantage that the removal of heat generated by the semiconductor chip during operation of the power module may be highly efficient as a consequence of the cooling channel design of the package. This may be achieved by integrating or embedding one or preferably more than one partially encapsulated cooling channels into the package thermally coupled to the chip. Arranging preferably multiple partially encapsulated cooling channels, being thermally coupled to the chip, preferably on two opposing external surfaces of the chip, results advantageously in a highly efficient double-sided cooling. Consequently, a coolant (such as a cooling fluid) flowing internally within the one or more cooling channels for thermally interacting with the chip(s) for performing a heat exchange is enabled to efficiently remove heat generated by the chip(s) during operation of the package. Highly advantageously, the cooling channel(s), in particular a cooling plate with at least one such cooling channel, may be oriented with its circumferential surface partially towards an interior of the module, i.e. towards the encapsulant and/or the chip, and partly towards an exterior of the module, i.e. away from the encapsulant and/or the chip. By taking this measure, the heat exchange between coolant and chip on the one hand, as well as between coolant and cooling channel with the environment is efficiently promoted, thereby obtaining a very high cooling efficiency.

In view of the extremely efficient cooling performance of the module or package, the latter may be used for an automotive application in a vehicle. In such a technical environment (for instance in terms of an inverter of an at least partially electrically powered vehicle), heat generation is remarkable and an efficient heat removal capability is of utmost importance. Furthermore, an automotive environment provides the opportunity to use operating liquid of such a vehicle (in particular water) as coolant to be conducted through the at least one cooling channel.

DESCRIPTION OF FURTHER EXEMPLARY EMBODIMENTS

In the following, further exemplary embodiments of the power module, the package, the vehicle, and the methods will be explained.

In an embodiment, the at least one cooling channel comprises a first cooling channel thermally coupled to a first main surface of the semiconductor chip. Thus, an efficient removal of heat from the first main surface of the semiconductor chip is enabled.

In an embodiment, the at least one cooling channel comprises at least one further first cooling channel thermally coupled to the first main surface of the semiconductor chip. Hence, multiple cooling channels may simultaneously remove heat from the first main surface, thereby obtaining an excellent cooling performance.

In an embodiment, the first cooling channel and the at least one further first cooling channel form part of an integral first cooling body, in particular the same cooling plate. All first cooling channels may form part of the first cooling plate. This first cooling plate may be arranged on or substantially in parallel to the first main surface of the semiconductor chip. Therefore, one integrally formed body may be provided which may be made of a highly thermally conductive material and may accommodate multiple cooling channels. Such a cooling plate may be manufactured with low cost and low effort, for instance by extruding. Parallel flow of coolant through the multiple first cooling channels may result in an efficient heat removal.

In an embodiment, the power module comprises at least one spacer body, in particular at least one thermally conductive spacer body, arranged between the semiconductor chip and the one or more first cooling channels/the first cooling plate. By a bulky spacer body made of a thermally highly conductive material such as copper, it is possible to further promote heat removal from the corresponding main surface of the semiconductor chip. The spacer body may preferably contact substantially the entire main surface of the semiconductor chip to provide a particularly pronounced heat removal capability. The at least one spacer body may simultaneously balance out height differences between various components of the module or package.

In an embodiment, the at least one cooling channel comprises a second cooling channel thermally coupled to a second main surface (which may oppose the first main surface) of the at least one semiconductor chip. Thus, the power package may be configured for double-sided cooling, i.e. on one side via the at least one first cooling channel (in particular forming part of a first cooling plate) and on the other side via the at least one second cooling channel (in particular forming part of a second cooling plate). This renders the power package also appropriate for applications, such as automotive applications, in which enormous amounts of heat are generated and need to be removed from the power package. However, it should be emphasized that other exemplary embodiments of the invention rely on single-sided cooling rather than on double-sided cooling.

In an embodiment, the at least one cooling channel comprises at least one further second cooling channel thermally coupled to the second main surface of the semiconductor chip. Thus, also on the second main surface, parallel cooling by guiding coolant along multiple cooling channels adjacent to the second main surface of the semiconductor chip can be accomplished to further improve the cooling efficiency.

In an embodiment, the second cooling channel and the at least one further second cooling channel form part of an integral second cooling body, in particular an integral second cooling plate. All second cooling channels may form part of the second cooling plate. It may be arranged on or substantially in parallel to the second main surface of the semiconductor chip. Highly advantageously, one and the same type of cooling plate may be used on both opposing main surfaces of the one or more electronic chips. This further reduces the effort and cost for manufacturing the cooling package.

In an embodiment, at least one of the first cooling body (which may in particular be a first cooling plate) and the second cooling body (which may in particular be a second cooling plate) comprises or consists of a ceramic body (in particular a dielectric ceramic body) or a metal body (in particular a metal body with a dielectric coating or surface). In particular an extruded ceramic profile or a metallic profile with internal channels can be manufactured with low cost. An electrically insulating coating of an electrically conductive cooling body (such as a cooling plate) electrically isolates the respective cooling plate from the at least one semiconductor chip or a wiring structure for electrically contacting the at least one semiconductor chip and thereby prevents an undesired short-circuit.

In an embodiment, at least one of the first cooling body and the second cooling body comprises an electrically conductive wiring structure configured for electrically connecting the one or more semiconductor chips with regard to an environment. When such an electrically conductive wiring structure, for instance a patterned metal layer, is bonded or deposited on a dielectric coating of the respective cooling body or is bonded or deposited on a fully dielectric cooling body, the provision of a chip carrier between this cooling plate and the respective semiconductor chip may be dispensable, because the tiny wiring structure may fulfil the same function. This allows to manufacture highly compact and lightweight power packages without compromising on the freedom to design any desired electric connection architecture of the at least one semiconductor chip.

In an embodiment, a plurality of cooling channels are aligned in parallel to one another. In one embodiment, separate coolant flows through different parallel cooling channels. In another embodiment, the same coolant flows through different cooling channels which may be interconnected, for instance by a meandrous channel structure or a bifurcated channel network within a cooling body such as a cooling plate. The described architectures allow for a cost-efficient manufacture of the cooling plates, in particular by extrusion or by molding (for instance injection molding), and allows to adjust the providable cooling power by adjusting the number of parallel cooling channels.

In an embodiment, the encapsulant comprises a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity may be embedded in an epoxy-based matrix of the encapsulant.

In an embodiment, the semiconductor chip comprises at least one integrated circuit element of a group consisting of a switch, in particular a transistor switch, more particularly an insulated gate bipolar transistor, a diode, a half bridge, and an inverter. However, other electronic applications may be realized by the one or more semiconductor chips of the power package as well.

In an embodiment, the power module comprises a coolant supply unit configured for driving coolant, in particular at least one of a liquid coolant and a gaseous coolant, to flow through the at least one cooling channel. For instance, the cooling supply unit may be manufactured in a cost-efficient way by injection molding. An operation liquid, such as water or a cooling liquid, as available in a car may be used when the power package is implemented in an automotive application.

In an embodiment, the power module comprises a chip carrier between a first main surface of the semiconductor chip and the first cooling plate/the at least one first cooling channel. Correspondingly, the power module may comprise a further chip carrier on a second main surface of the semiconductor chip opposing the first main surface. The at least one semiconductor chip may be connected to the respective chip carrier for instance using an adhesive, by soldering, by welding, and optionally indirectly via a further component (such as a spacer body), etc.

In an embodiment, at least one of the chip carrier and the further chip carrier is configured as one of the group consisting of a leadframe, a metal-electric insulator and thermal conductor-metal sheet stack, a Direct Copper Bonding (DCB) substrate, and a Direct Aluminium Bonding (DAB) substrate. A leadframe may be a metal structure inside a chip package that is configured for carrying signals from the electronic chip to the outside, and/or vice versa. The electronic chip inside the package or electronic component may be attached to the leadframe, and then bond wires may be provided for attaching pads of the electronic chip to leads of the leadframe. Subsequently, the leadframe may be molded in a plastic case or any other encapsulant. Alternative chip carriers which may be used for other embodiments can be any interposer like a substrate, a ceramic substrate, a laminar substrate, a DCB (Direct Copper Bonded Substrate), an IMS (Insulated Metal Substrate), a PCB (printed circuit board), etc.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on widebandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier. In such an embodiment, double-sided cooling is of high importance.

In embodiments, the semiconductor chips may form a circuit functioning as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the power module or package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the module or package according to an exemplary embodiment is fully compatible with standard packaging concepts (in particular fully compatible with standard TO packaging concepts) and appears externally as a conventional module or package, which is highly userconvenient. In an embodiment, the package is configured as power module, for instance a molded power module.

As substrate or wafer forming the basis of the semiconductor chip(s) or electronic chip(s), a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION OF EXEMPLARY EMBODIMENTS

Figure 1:
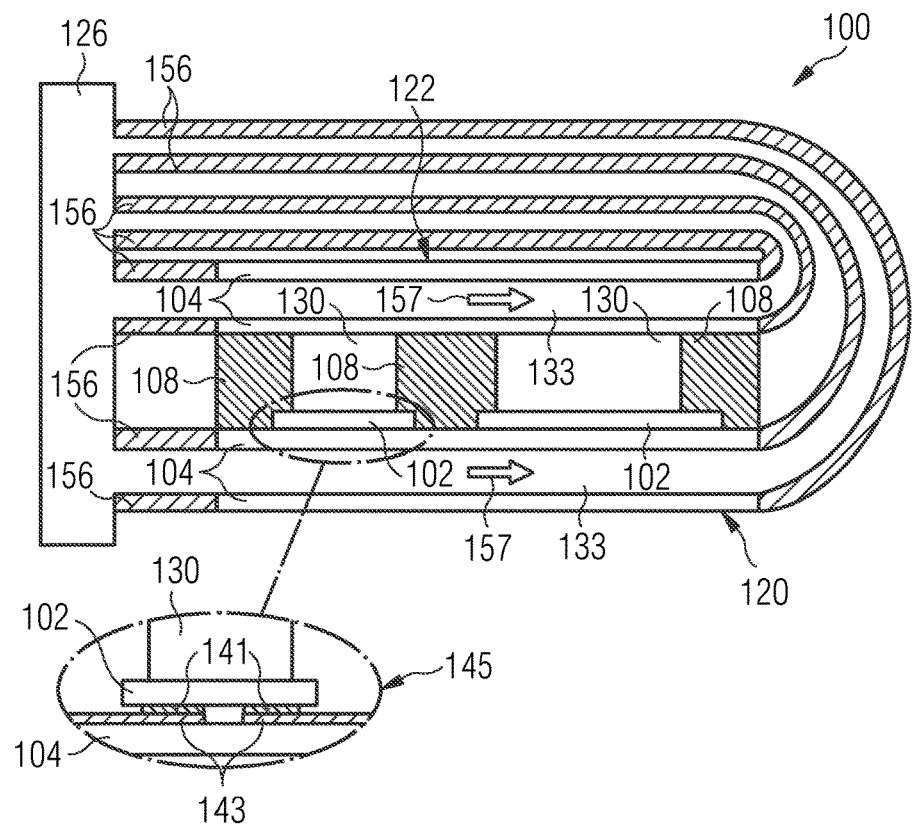
FIG. 1 shows a power module according to an exemplary embodiment.

The illustration in the drawing is schematically.

Before describing further exemplary embodiments in further detail, some basic considerations of the present inventors will be summarized based on which exemplary embodiments have been developed which provide for a cost-efficient cooling of a power module.

According to an exemplary embodiment of the invention, a highly efficiently cooled package or power module is provided (in particular cooled from two sides, i.e. providing a double-sided cooling performance). However, other embodiments provide an efficient single sided cooling architecture.

Increased power density of molded power modules requires new solutions for heat removal. Conventional concepts reach their limits, in particular for applications such as automotive applications in which the generated amount of heat is enormous.

In view of these considerations, an exemplary embodiment of the invention provides a module (in particular a module with a double-sided cooling configuration), wherein one or more cooling channels (in particular integrated in one or more cooling plates) are directly embedded or integrated into the module or package. A coolant such as a cooling fluid may flow through the one or more cooling channels, to thereby provide a direct cooling performance. As a result, a highly complex system with excellent heat removal power can be obtained.

Highly advantageously, the integrated or embedded cooling channels may be partially exposed to an environment so that, in addition to the heat removal by the flowing coolant, an additional heat removal contribution by heat conduction, heat convection and/or heat radiation via an exposed surface of the cooling channel(s) or cooling plate(s) may be accomplished. In particular, part of an exterior surface of the module or package may be constituted by the surface of the cooling channel(s) or cooling plate(s). However, another part of the outer surface of the surface of the cooling channel(s) or cooling plate(s) may contact or face the encapsulant, the semiconductor chip(s), one or more chip carriers, one or more spacer bodies, etc. of the module or package. The cooling plate and the cooling channels have an outer circumference (not exposed to the coolant). A part of this outer circumference may be in contact with encapsulant, chip(s) and/or other package material, whereas another part of this outer circumference may be exposed to an environment of the package or module. This additionally promotes heat removal from the heated coolant/cooling plate/cooling channel via its externally exposed surface to the environment.

According to an exemplary embodiment of the invention, a double-sided cooling performance of one or more semiconductor chips may be achieved by the implementation of tiny fluid conduits, which may for instance be made of ceramic or other thermally conductive material (for instance a dielectrically coated metal), directly into the mold package, however with surface exposure. In this context, the one or more semiconductor chips (which may have pads on one or both opposing main surfaces, wherein thermally conductive spacer bodies can be additionally provided on one or both main surfaces) can be directly connected with the surface of the cooling channels or may be connected to the cooling channels via an additional mounting plate or chip carrier, which can then, in turn, be connected with the cooling channel(s). In terms of a double-sided cooling architecture, a void volume between two opposing sets of cooling channels or cooling plates may be filled with an encapsulant, for instance a mold compound.

FIG. 1 shows a cross-sectional view of a package or power module 100 according to an exemplary embodiment.

The power module 100 comprises two semiconductor chips 102 mounted on a lower cooling plate 120 (only a cross section thereof is shown in FIG. 1, however reference is made to FIG. 2 to FIG. 6). Although not shown, the power semiconductor chips 102 may each comprise one or more integrated circuit elements formed therein, for instance a transistor switch, a diode, etc. The semiconductor chips 102 may have pads 141 on an upper main surface and/or on a lower main surface thereof. The lower cooling plate 120 is equipped with multiple cooling channels 104 which extend parallel to one another (not shown in FIG. 1, where only one cooling channel 104 in the lower cooling plate 120 is visible). In an interior of each cooling channel 104, a respective hollow lumen 133 is defined which serves for accommodating the coolant during operation. The flowing direction of the coolant is indicated by arrows 157. The lower cooling plate 120 is thermally coupled to the semiconductor chips 102. A coolant, such as a liquid like water, is guidable through the cooling channels 104 for actively cooling the semiconductor chips 102 during operation of the power module 100. Furthermore, a mold-type encapsulant 108 is provided which fully encapsulates the semiconductor chips 102 and only partially encapsulates interior surface portions of the cooling channels 104, while keeping exterior surface portions of the cooling channels 104 exposed to an environment outside of the power package 100.

Consequently, a lower main surface of the lower cooling plate 120, which cools the lower main surfaces of the semiconductor chips 102, forms part of an external surface of the power module 100. Thus, a module internal section of the cooling channels 104 in the lower cooling plate 120 is circumferentially partially covered by the encapsulant 108 and is partially exposed from the encapsulant 108. The cooling function of the power module 100 is therefore based, on the one hand, on a cooling due to the flowing coolant which guides away heat from the semiconductor chips 102 during operation. On the other hand, the fact that the lower surface of the power package 100 is partly formed by the thermally conductive material of the cooling channels 104 of the lower cooling plate 120 also allows additional heat to be removed by the exposed highly thermally conductive material of the cooling plate 120 which usually has a significantly higher thermal conductivity than the material of the encapsulant 108.

A respective thermally conductive spacer body 130, for instance a copper block, is arranged on an upper main surface of each of the semiconductor chips 102 to further promote heat removal from the semiconductor chips 102 during operation. A top surface of the spacer bodies 130 is brought into a direct thermally conductive connection with an upper thermally conductive cooling plate 122 which can be configured in the same way as the lower cooling plate 120. In other words, the cooling plate 122 also has a plurality of parallel aligned cooling channels 104 and is made of ceramic material.

Consequently, also an upper main surface of the upper cooling plate 122, which cools the upper main surfaces of the semiconductor chips 102 via the thermally conductive spacer bodies 130, forms part of an external surface of the power module 100. Thus, a module internal section of the cooling channels 104 in the upper cooling plate 122 is also circumferentially partially covered by the encapsulant 108 and partially exposed from the encapsulant 108. In combination with the above described properties of the lower cooling plate 120, the upper cooling plate 122 provides for a double-sided cooling of the semiconductor chips 102.

As can be taken from a detail 145 in FIG. 1, the upper main surface of the first cooling plate 120 (additionally or alternatively the lower main surface of the second cooling plate 122) may comprise an electrically conductive wiring structure 143 configured for electrically connecting the one or more pads 141 the semiconductor chips 102 with regard to an environment. Thus, any desired electric contact configuration may be achieved for instance by attaching and patterning a metal foil on the respective cooling plate 120, 122 or by depositing and patterning an electrically conductive layer thereon, to thereby constitute the electrically conductive wiring structure 143.

The planar upper and lower main surfaces of the semiconductor chips 102 as well as the planar upper and lower main surfaces of the cooling plates 120, 122 may be aligned in parallel to one another (horizontally according to FIG. 1). The cooling channels 104 of the cooling plates 120, 122 may be aligned parallel to one another within a horizontal plane perpendicular to the paper plane of FIG. 1. Thus, a flat and hence very compact configuration with excellent cooling performance can be obtained.

Before operation of the power module 100 (which may be used for an automotive application, for instance as an inverter in an electrically driven vehicle), a coolant supply unit 126 may be connected fluidically to the cooling channels 104 so as to conduct a coolant (for instance water) through the cooling channels 104 for cooling the semiconductor chips 102. The coolant supply unit 126 may be fluidically coupled with the cooling channels 104 by a tubing structure 156, which is configured flexibly in the shown embodiment. The cooling supply unit 126 is configured for pumping the coolant to flow through the cooling channels 104 along a closed loop as indicated schematically in FIG. 1. According to FIG. 1, the cooling channels 104 in both cooling plates 120, 122 are encapsulated only partially within the encapsulant 108 which renders heat removal even more efficient.

In order to manufacture the power module 100 shown in FIG. 1, the semiconductor chips 102 are mounted, for instance by soldering, on the lower cooling plate 120 and are connected via the spacer bodies 130, which may be embodied as highly thermally conductive cuboids, to upper cooling plate 122. The latter connection may be accomplished by soldering as well. The highly thermally conductive spacer bodies 130 additionally improve the heat removal capability of the power module 100 and contribute to the active cooling performance. They may be made of copper, silicon carbide in an aluminum matrix, molybdenum, etc. The void region between the cooling plates 120, 122 may then be filled with a mold compound as encapsulant 108. For example, the cooling plates 120, 122 may be embodied as ceramic bodies with various lumen 133 defined by the cooling channels 104. A coolant, for instance water, air, nitrogen, or a volatile/evaporable liquid, may be conducted through the cooling channels 104 for promoting heat removal during operation of the power module 100. As shown in FIG. 1, electrically conductive wiring structure 143 may be sandwiched between the semiconductor chips 102 and the lower cooling plate 120, for providing an electric connection of the semiconductor chips 102 with regard to an electronic periphery of the power module 100.

Figure 2:
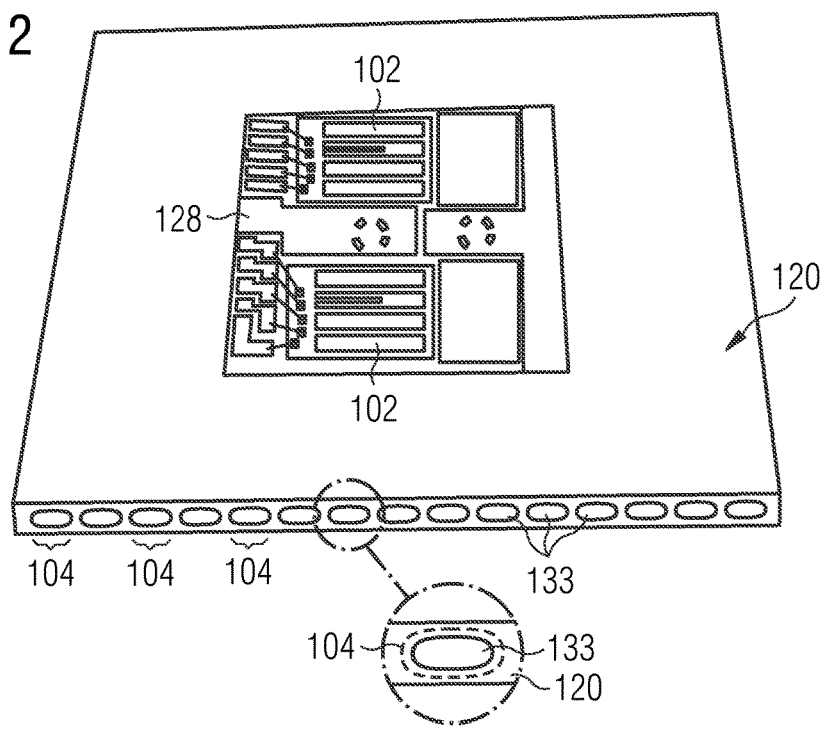
FIG. 2 to FIG. 4 show three-dimensional views of a preform of a power module according to an exemplary embodiment in different states during carrying out a method of manufacturing a power module.
Figure 3:
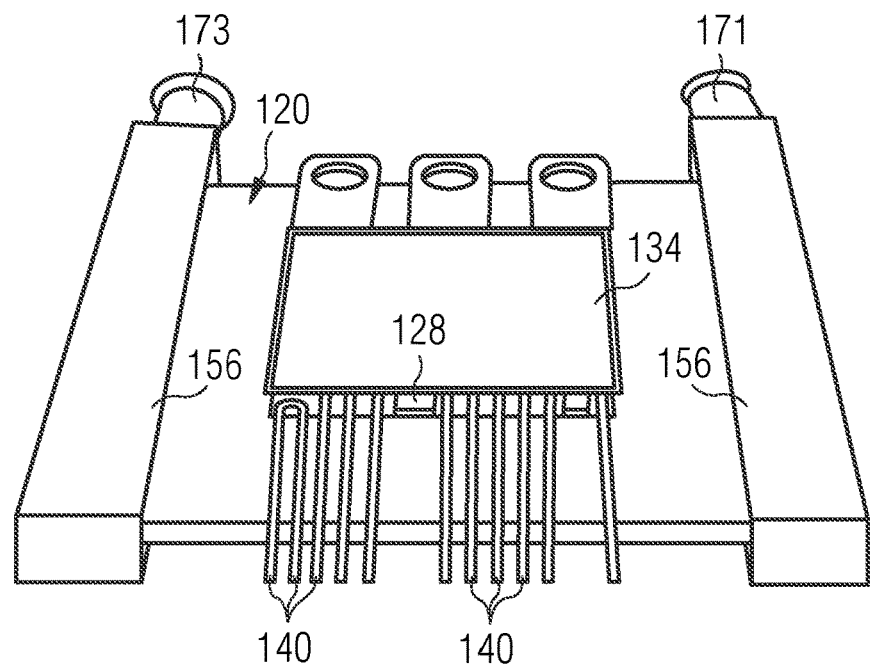
Figure 4:
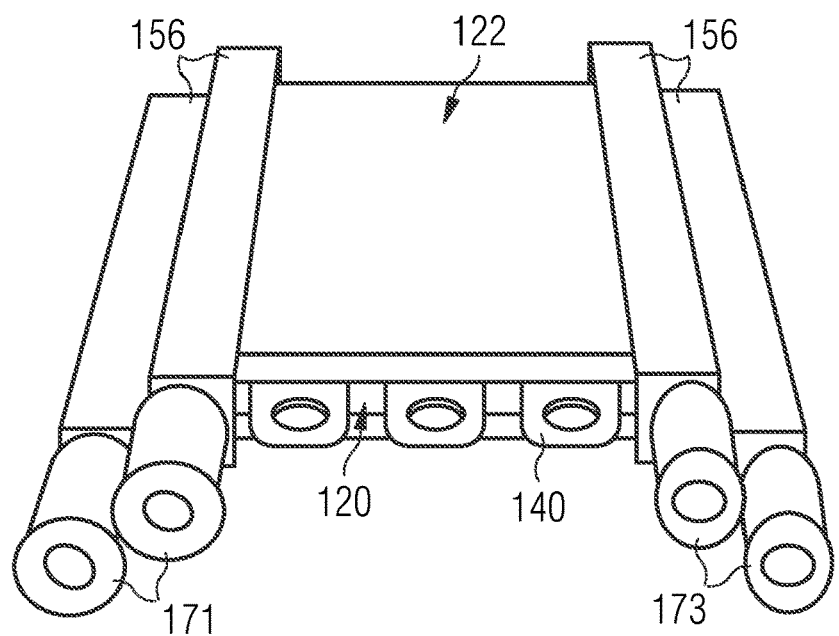

FIG. 2 to FIG. 4 show three-dimensional views of preforms of a power module 100 according to an exemplary embodiment in different states during carrying out a method of manufacturing the power module 100.

Referring to FIG. 2, lower cooling plate 120 made of a ceramic material (such as aluminum nitride) is shown on which a Direct Copper Bonding (DCB) substrate is mounted as lower chip carrier 128. Alternatively, the lower chip carrier 128 may be a leadframe, etc. The cooling plate 120 may be manufactured with low effort by extrusion. Subsequently, the semiconductor chips 102 are mounted on the chip carrier 128, for instance by soldering. Alternatively, it is possible that a mechanic wiring structure (not shown) is applied on the lower cooling plate 120 for electrically contacting the semiconductor chips 102. In such a scenario, the lower chip carrier 128 can be omitted.

Referring to FIG. 3, optional spacer bodies 130 (not visible in FIG. 3) may be mounted on the semiconductor chips 102 and may be covered by a second chip carrier 134, which can be embodied as a further Direct Copper Bonding (DCB) substrate. Alternatively, the upper chip carrier 134 may be a leadframe or the like. The lower chip carrier 128, which can also be denoted as lower mounting plate, can be connected by a leadframe 140 to thereby form module external leads. As an alternative to the upper chip carrier 134, it is again possible to provide an electrically conductive wiring structure on the main surface of the further cooling plate 122 which faces the semiconductor chips 102.

A first part of a—here rigid—tubing structure 156 for providing fluid communication with a coolant supply unit 126 (not shown in FIG. 3) is attached to the lower cooling plate 120. A fluid conduit of tubing structure 156 is thereby fluidically coupled to the cooling channels 104 of the lower cooling plate 120. Tubing structure 156 may later form part of the readily manufactured power package 100.

Referring to FIG. 4, the upper chip carrier 134 may be covered and thermally connected to upper cooling plate 122, which can be a further ceramic cooling body. A second part of the—here rigid—tubing structure 156 for providing fluid communication with coolant supply unit 126 (not shown in FIG. 4) is attached to the upper cooling plate 122. A further fluid conduit of tubing structure 156 is thereby fluidically coupled to the cooling channels 104 of the upper cooling plate 122.

Although not shown in FIG. 4, the void region between the upper and the lower cooling plates 120, 122 is subsequently encapsulated by an encapsulant 108, which may be embodied as a mold compound. The cooling plates 120, 122 may be fluidically coupled with coolant by tubing structure 156. For this purpose, the coolant may be supplied via coolant inlets 171 of tubing structure 156 and may be drained via coolant outlets 173 of tubing structure 156.

Figure 5:
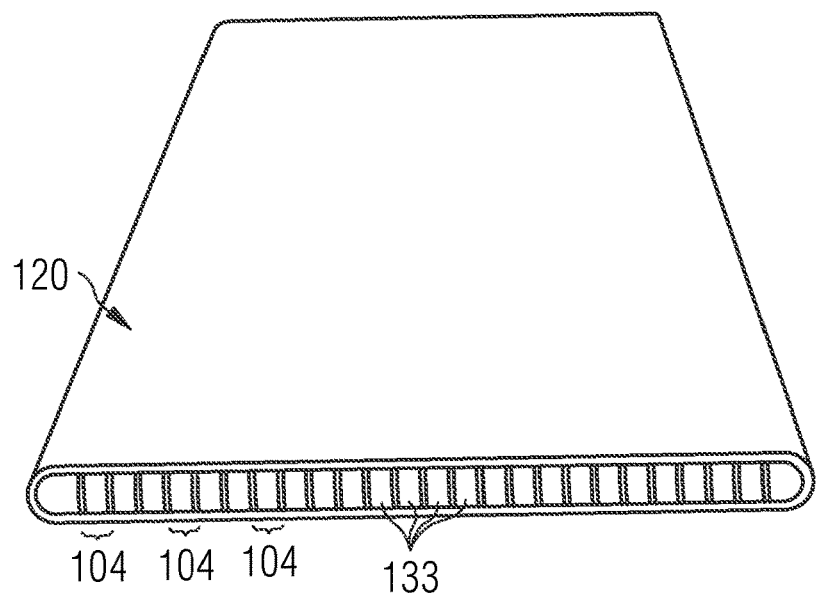
FIG. 5 and FIG. 6 show three-dimensional views of a preform of a power module according to another exemplary embodiment in different states during carrying out a method of manufacturing a power module.
Figure 6:
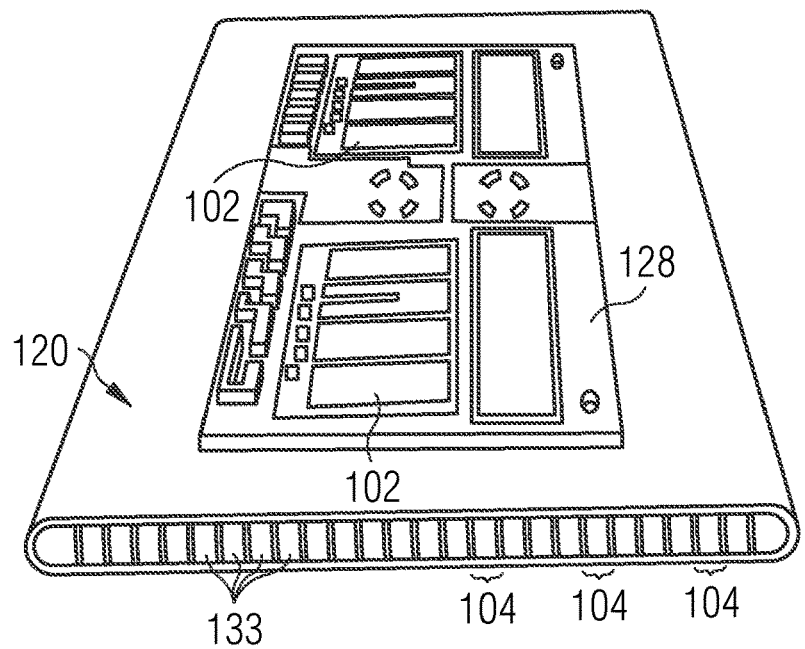

FIG. 5 and FIG. 6 show three-dimensional views of preforms of a power module 100 according to another exemplary embodiment in different states during carrying out a method of manufacturing the power module 100.

Referring to FIG. 5, an alternative to the ceramic-type cooling plates 120, 122 according to FIG. 1 to Figure is shown. According to FIG. 5, cooling plate 120 is embodied as a metal profile (for instance made of aluminum) which may be coated with an electrically insulating layer (for preventing undesired electric short-circuiting). This ensures an electric decoupling between cooling plates 120, 122 on the one hand and the power semiconductor chips 102 on the other hand. Such a coating may be formed for instance by printing a dielectric layer on the metal profile or by oxidizing a metallic surface (such as aluminum) to form an electrically insulating surface (such as aluminum oxide). Advantageously, such a coating may be embodied so that an electric breakthrough voltage is in a range between 1 kV and kV. Such a coating may be formed by physical vapor deposition (PVD), chemical vapor deposition (CVD), galvanically, etc.

It is also possible to apply an electrically conductive wiring structure (such as a patterned copper layer) onto the dielectric layer, in order to render a lower chip carrier 128 (see FIG. 6) dispensable.

Alternatively, it is possible that the metal profile is used as cooling plate 120 without dielectric coating.

Referring to FIG. 6, a lower chip carrier 128 (such as a DCB substrate) can be attached onto the metal profile. In such a scenario, a dielectric coating of the cooling plate 120 may for example be omitted.

Figure 7:
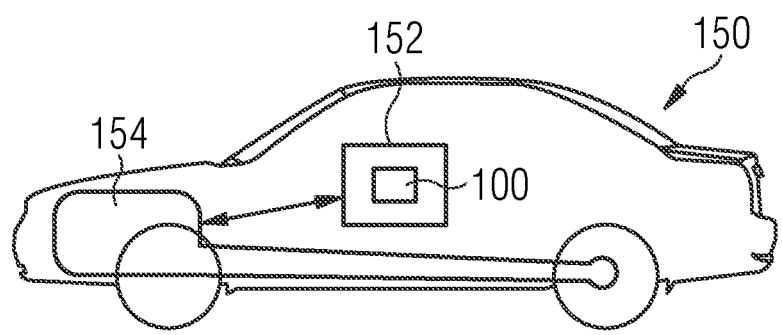
FIG. 7 illustrates schematically a vehicle comprising a power package according to an exemplary embodiment of the invention.

FIG. 7 illustrates schematically a vehicle 150 comprising a power package 100 according to an exemplary embodiment of the invention. More specifically, the power package 100 may form part of a control block 152 controlling operation of engine/battery block 154. Hence, a package or power module 100 according to an exemplary embodiment of the invention may be used for an automotive application. A preferred application of such a power package 100 is an implementation as an inverter circuit or inverted rectifier for vehicle 150 which may be an electrically driven vehicle or which may be a hybrid vehicle. Such an inverter may transfer a direct current (DC) of the battery into an alternating current (AC) for driving the electric engine of vehicle 150. In a hybrid vehicle, it is also possible to at least partially recover mechanical energy and to transfer it, by the inverter, back into electric energy to recharge the battery. In such an automotive inverter application, extreme amounts of heat are generated during operation of the power module 100. This heat can be efficiently removed by the double-sided cooling concept according to FIG. 1 to FIG. 6. However, it should be said that, in other embodiments, also single-sided cooling may be sufficient.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A power module, comprising:
    a semiconductor chip;
    at least one cooling plate with at least one cooling channel integrally formed therein, thermally coupled to a first main surface of the semiconductor chip and being configured so that a coolant is guidable through the at least one cooling channel; and
    an encapsulant encapsulating at least part of the semiconductor chip and part of the at least one cooling channel;
    a second cooling channel thermally coupled to a second main surface of the semiconductor chip opposing the first main surface;
    an electrically conductive wiring structure which is configured for electrically connecting the semiconductor chip with regard to an environment and which is attached to a surface of the cooling plate;
    wherein at least part of a main surface of the cooling plate forms part of an external surface of the power module.

2. The power module according to claim 1, wherein the at least one cooling channel comprises at least one further first cooling channel thermally coupled to the first main surface of the semiconductor chip.

3. The power module according to claim 2, wherein the first cooling channel and the at least one further first cooling channel form part of the same cooling plate, in particular being arranged substantially in parallel to the first main surface of the semiconductor chip.

4. The power module according to claim 1, comprising a spacer body, in particular a thermally conductive spacer body, arranged between the semiconductor chip and the first cooling channel.

5. The power module according to claim 1, wherein the at least one cooling channel comprises at least one further second cooling channel thermally coupled, in particular by a direct metallic or plastic contact, to the second main surface of the semiconductor chip.

6. The power module according to claim 1 wherein the second cooling channel and the at least one further second cooling channel form part of a further common cooling plate, in particular being arranged substantially in parallel to the second main surface of the semiconductor chip.

7. The power module according to claim 1, wherein at least one of the cooling plate and the at least one cooling channel comprises or consists of at least one of the group consisting of a ceramic body, and a metal body, in particular a metal body with a dielectric coating.

8. The power module according to claim 1, wherein the encapsulant comprises or consists of a mold-type encapsulant.

9. The power module according to claim 1, comprising a coolant supply unit configured for driving coolant, in particular at least one of a liquid coolant and a gaseous coolant, to flow through the at least one cooling channel.

10. The power module according to claim 1, comprising a chip carrier between a first main surface of the semiconductor chip and at least one first cooling channel of the at least one cooling channel.

11. The power module according to claim 10, comprising a further chip carrier on a second main surface of the semiconductor chip opposing the first main surface.

12. The power module according to claim 10, wherein at least one of the chip carrier and the further chip carrier is configured as at least one of the group consisting of a leadframe, a metal-electric insulator and thermal conductor-metal sheet stack, a Direct Copper Bonding substrate, and a Direct Aluminium Bonding substrate.

13. The power module according to claim 1, wherein the at least one cooling plate is configured for direct cooling by a coolant in the form of a liquid and/or a gas.

14. A vehicle, comprising a power module according to claim 1.

15. A package, comprising:
    an electronic chip having a first main surface and an opposing second main surface;
    a first cooling channel integrally formed within a cooling plate, thermally coupled to the first main surface of the electronic chip and being configured so that a coolant is guidable through the first cooling channel;
    a second cooling channel thermally coupled to the second main surface of the electronic chip and being configured so that a coolant is guidable through the second cooling channel;
    an encapsulant encapsulating at least part of the electronic chip, part of the first cooling channel and part of the second cooling channel;
    an electrically conductive wiring structure which is configured for electrically connecting the semiconductor chip with regard to an environment and which is attached to a surface of the cooling plate;
    wherein at least a section of at least one of the first cooling channel and the second cooling channel is circumferentially partially covered by the encapsulant and partially exposed from the encapsulant.

* * * * *